United States Patent [19]

Kushibiki et al.

[11] Patent Number: 4,866,503
[45] Date of Patent: Sep. 12, 1989

[54] SEMICONDUCTOR STACK

[75] Inventors: Ryouichi Kushibiki, Kiyose; Tadamichi Fukutake, Hannou, both of Japan

[73] Assignee: Kabushiki Kaisha Toshiba, Kawasaki, Japan

[21] Appl. No.: 169,750

[22] Filed: Mar. 18, 1988

[30] Foreign Application Priority Data

Apr. 8, 1987 [JP] Japan .................................. 62-52139

[51] Int. Cl.$^4$ ..................... H01L 27/02; H01L 23/02; H01L 23/04
[52] U.S. Cl. ........................................ 357/51; 357/81; 357/82; 363/141
[58] Field of Search ............................. 357/51, 81, 82; 363/141; 338/215; 337/190; 361/347, 349, 379, 386

[56] References Cited

U.S. PATENT DOCUMENTS 3,947,868  1/1976  Nitsche et al. ........................ 357/81
4,460,956  7/1984  Hamasaki ............................... 357/82
4,554,574 11/1988  Wright .................................... 357/81

FOREIGN PATENT DOCUMENTS 57-13970  1/1982  Japan .

Primary Examiner—J. Carroll
Attorney, Agent, or Firm—Foley & Lardner, Schwartz, Jeffery, Schwaab, Mack, Blumenthal & Evans

[57] ABSTRACT

A semiconductor stack including a semiconductor element such as a thyristor and a gate turnoff element, at least one heat sink for cooling the semiconductor element, a first conductor plate having at least one slit in order to form at least two branches in its one end portion, clamp members for tightly fastening the semiconductor element, the heat sink and the first conductor plate in series, and at least two fuse members secured in parallel between a second conductor plate and the branches of the first conductor plate, thereby removing a tensile stress given to the fuses. The slit may be formed in the second conductor plate instead of the first conductor plate.

10 Claims, 4 Drawing Sheets

SEMICONDUCTOR STACK

BACKGROUND OF THE INVENTION

1. Field of the Invention

The present invention relates to a semiconductor stack including a semiconductor element such as a thyristor and a gate turnoff element and a fuse connected to the semiconductor element in series for protecting the semiconductor element from a breakdown due to an overcurrent.

2. Description of the Prior Art

In a conventional semiconductor converter, there have been a variety of countermeasures for protecting a semiconductor element such as a thyristor and a gate turnoff element from a breakdown caused by an overcurrent. For instance, a fuse has been widely used for preventing the overcurrent of the semiconductor element because of an simple and exact means as compared with other methods.

Recently, a capacity of a semiconductor element has been remarkably enlarged, for example, a semiconductor element having a rated current of several thousands of amperes has been used. Accordingly, a protective fuse having a large capacity has been demanded. However, there is no fuse having the same capacity as that of such a semiconductor element having an enlarged capacity, and hence, in practice, a plurality of fuses connected in parallel are used.

Conventionally, when a plurality of fuses are connected in parallel to one another, as shown in FIG. 1, a pair of conductor couplers 2 having a L-shaped cross section are attached to both ends of each of fuse members 1, and then the couplers 2 attached to the fuse members 1 are secured to a pair of conductor plates 3a and 3b. Alternatively, as shown in FIG. 2, both the ends of the fuse members 1 are directly secured to the conductor plates 3a and 3b without using the couplers 2.

In this case, generally, the connected fuse members 1 are so mounted in proximity to a semiconductor stack as to be readily exchanged with other ones while one of the conductor plates 3a and 3b is connected to the semiconductor stack.

In the first conventional method for connecting the fuse members 1 to the conductor plates 3a and 3b using the couplers 2, as shown in FIG. 1, approximately a double space for connecting is required as compared with the second conventional method for connecting the fuses 1 the conductor plates 3a and 3b without using the couplers 2, as shown in FIG. 2. Particularly, when the fuses 1 are directly connected to the conductor plates 3a and 3b in parallel without using the couplers 2, as shown in FIG. 2, in fact, a tensile stress is often given to the fuses 1 due to the differences among the lengths of the fuses 1 or the differences among the parallelism of the contact end surfaces of the fuses 1. As to the fuse 1 now practically used, the external periphery is made of a ceramic material or the like, and thus the fuse 1 is very fragile against the tensile stress. Therefore, the fuses 1 have been sometimes broken down by the tensile stress.

Further, in the conventional converter, when the semiconductor stack and the fuses are separately mounted, a particular conductor member is required to connect these members. In addition, since it is necessary that the fuses are so mounted as to readily replaced by other ones, the space for mounting the fuses becomes necessarily large, and hence the apparatus cannot be miniaturized.

Further, since a heat loss generated from the fuses is large, it is often necessary to cool the surfaces of the fuses. When the surfaces of the fuses are cooled, their insulator portions made of the ceramic material or the like are cooled by using an airflow having a several m/sec flow speed, or the temperature of the contact surfaces of the fuses is reduced to below a certain value by using a heat sink.

In general, a cooling type of the fuses is determined depending on a cooling type of the semiconductor element, that is, when an air-cooling semiconductor element is used, the insulator portions of the fuses are cooled by an airflow, or, when a water-cooling semiconductor element is used, the contact surfaces of the fuses are cooled by using a water-cooling heat sink. When the insulator portions of the fuses are air-cooled, a small cooling fan is arranged in front of the fuses or a cooling fan installed for cooling the semiconductor element and the like is utilized.

In the conventional semiconductor converter having the air-cooling fuses and the small cooling fan arranged in front of the fuses, the small cooling fan is necessarily arranged in close proximity to the fuses in order to obtain the necessary airflow speed such as several m/sec. Accordingly, in a conventional semiconductor converter in which a plurality of fuses are dispersedly arranged, at least the same number of the cooling fans as the dispersed number of the fuses are required. Since the cooling fan includes a rotating machine, abrasion and vibration are generated, and a failure rate of the cooling fan is high as compared with the parts of the semiconductor element. Further, the life of the cooling fan is short such as several years. Therefore, the increase of the number of the cooling fans brings a drop of the reliability of the whole apparatus. Furthermore, since a space for mounting the cooling fans is required, the entire apparatus is enlarged and accordingly the apparatus cannot be miniaturized.

In the conventional semiconductor converter including the air-cooling fuses and the cooling fan installed for cooling the semiconductor element, since the semiconductor stack and the fuses are arranged in the separate positions, the structure of the apparatus becomes complicated or the exchange of the fuses cannot be conducted so easily in order to flow the cooling air towards the fuses.

SUMMARY OF THE INVENTION

Accordingly, it is an object of the present invention to provide a semiconductor stack including a semiconductor element and fuse members connected thereto, free from the aforementioned disadvantages and defects of the prior art, which is capable of replacing fuses with new ones in a simple manner and of preventing a breakdown of the fuses due to an excessive tensile stress given thereto, and which has a simple structure and is compact in its construction.

In accordance with one aspect of the present invention, there is provided a semiconductor stack including a semiconductor element, at least one heat sink arranged in one side of the semiconductor element, for cooling the semiconductor element, a first conductor plate contacted with an opposite side of the heat sink to the semiconductor element, clamp members for tightly fastening the semiconductor element, the heat sink and the first conductor plate in series, a second conductor plate and at least two fuse members secured in parallel between the first and the second conductor plates, one of the first and the second conductor plates having at least one slit in its one end portion in order to form at least two branch portions, one ends of the fuse members being secured to the two branch portions of the one conductor plate, the other ends of the fuse members being secured to the other of the first and the second conductor plates.

BRIEF DESCRIPTION OF THE DRAWINGS

The above and other objects, features and advantages of the present invention will more fully appear from the following description of the preferred embodiments with reference to the accompanying drawings, in which.

DESCRIPTION OF THE PREFERRED EMBODIMENTS

Figure 1:
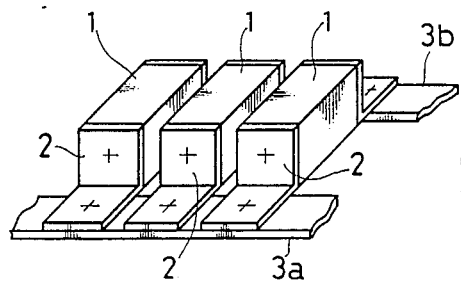
FIG. 1 is a perspective view of a conventional fuse mounting structure.
Figure 2:
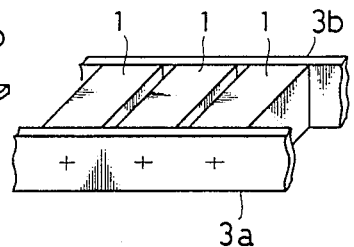
FIG. 2 is a perspective view of another conventional fuse mounting structure.
Figure 3:
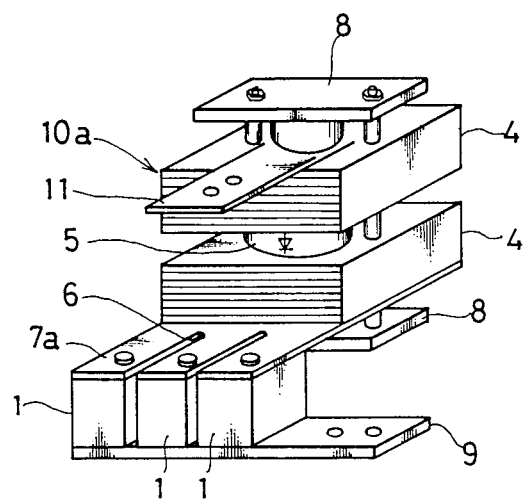
FIG. 3 is a perspective view of a first embodiment of a semiconductor, stack according to the present invention.
Figure 4:
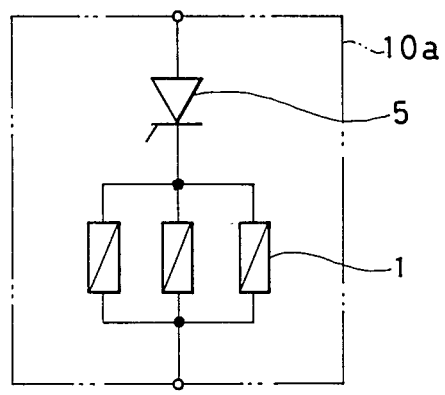
FIG. 4 is a circuit diagram of the semiconductor stack shown in FIG. 3.

Referring now to the drawings, wherein like reference characters designate like or corresponding parts throughout the several views, there is shown in FIGS. 3 and 4 a first embodiment of a semiconductor stack according to the present invention.

In the drawings, the semiconductor stack 10a includes a semiconductor element 5 such as a thyristor and a gate turnoff element, a pair of heat sinks 4 arranged in upper and lower ends of the semiconductor element 5, a conductor plate 7a having two slits 6 in its front end portion, contacted with the lower end of the lower heat sink 4, a terminal member 11 attached to the upper end of the upper heat sink 4, and a pair of clamp members 8 for tightly fastening the above members in series by using bolts and nuts. One ends of three fuse members 1 are directly secured in parallel to the slit front end portion of the conductor plate 7a, and the slits 6 separate the front mount end of the conductor plate 7a into three branch portions to which the respective fuse members 1 are respectively secured. The other ends of the fuse members 1 are secured to an external conductor plate 9. Hence, the three fuse members 1 connected in parallel between the conductor plates 7a and 9 below the lower heat sink 4 are linked to the semiconductor element 5 in series via the lower heat sink 4.

In this case, the thickness of the conductor plate 7a having the slits 6 is so determined as to allow the current for only one of the three fuses to pass, and accordingly the thickness of the conductor plate 7a may be approximately one third of that of the conductor plate 9. Further, by forming the slits 6, the branches of the front end portions of the conductor plate 7a can be independently bent without any compulsion, and hence the tensile stress caused by the differences among the lengths of the fuses 1 or by the differences among the parallelism of the contact end surfaces of the fuses 1 can be sufficiently removed to an uninfluencing amount. Further, the particular conductor member for connecting the fuses 1 to the semiconductor stack 10a is not required, and thus the space for mounting the fuses to the semiconductor stack becomes small.

Figure 5:
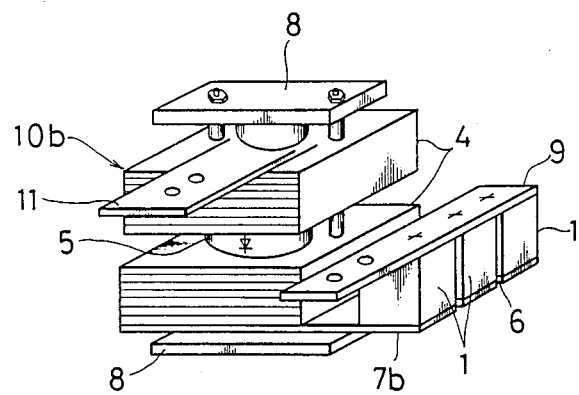
FIG. 5 is a second embodiment of a semiconductor stack according to the present invention.

In FIG. 5, there is shown a second embodiment of a semiconductor stack 10b having a similar construction to that of the first embodiment shown in FIG. 3, according to the present invention. In this embodiment, the semiconductor stack 10b includes a conductor plate 7b having slits 6 in its one side end portion, and a branched portion of the conductor plate 7b extends sideways. One ends of three fuse members 1 are secured to the three branch portions of the conductor plate 7b in parallel, and the other ends of the fuse members 1 are secured to an external conductor plate 9, thereby arranging the fuse members 1 near one side of a lower heat sink 4.

In this case, although three fuses 1 connected in parallel are used, of course, at least two fuses may be arranged in parallel in the same manner as described above. Further, although the slits 6 are formed in the conductor plate 7a or 7b contacted with the lower heat sink 4, slits may be cut in the external conductor plate 9 in the same manner as the conductor plate 7a or 7b, with the results of the same effects and advantages as those obtained in the conductor plate 7a or 7b.

Figure 6:
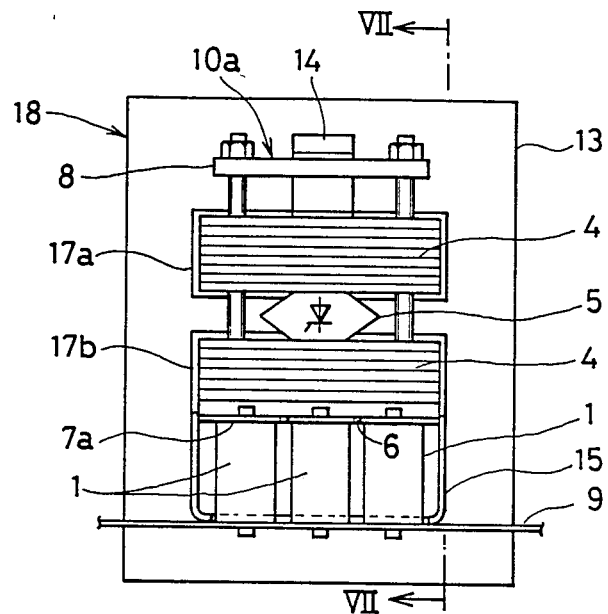
FIG. 6 is a front view of a semiconductor unit including the semiconductor stack of FIG. 3.
Figure 7:
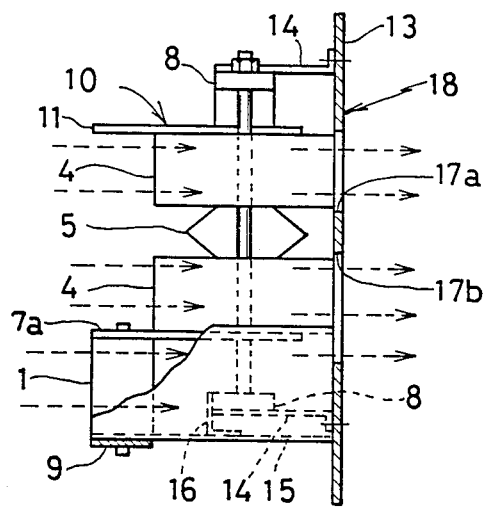
FIG. 7 is a longitudinal cross sectional view, taken along the line VII—VII of FIG. 6.

In FIGS. 6 and 7, there is shown a semiconductor unit 18 including the semiconductor stack 10a show in FIG. 3. The central portions of the upper and the lower clamp members 8 of the semiconductor stack 10a are secured to an insulating plate 13 through a pair of brackets 14, and a U-shaped insulating plate 15 having a U-shaped cross section is so mounted to the lower clamp member 8 through another bracket 16 that the U-shaped insulating plate 15 together with the conductor plates 7a and 9 may surround the fuse members 1 to constitute an airflow duct for the fuse members 1. The insulating plate 13 is provided with two rectangular openings 17a and 17b in order to flow a cooling air passing through the fuses 1 and the heat sinks 4. In this case, since the fuses 1 are surrounded by the conductor plates 7a and 9 and the U-shaped insulating plate 15, the cooling air is sucked into the opening 17b of the insulating plate 13 through the airflow duct composed of the U-shaped insulating plate 15 and the conductor plates 7a and 9 or through the spaces between the fuses 1 and the U-shaped insulating plate 15 and among the fuses 1.

The airflow speed of the cooling air passing through the fuses 1 is determined depending on the size of the opening 17b formed in the insulating plate 13, and hence the change of the airflow speed can be readily carried out by varying the size of the opening 17b. The fuses 1 can be readily replaced by new ones by detaching the conductor plates 7a and 9 without receiving any influence from the U-shaped insulating plate 15. Further, since the structure of the U-shaped insulating plate 15 is simple, the U-shaped insulating plate 15 does not almost affect the size of the semiconductor unit 18.

Figure 8:
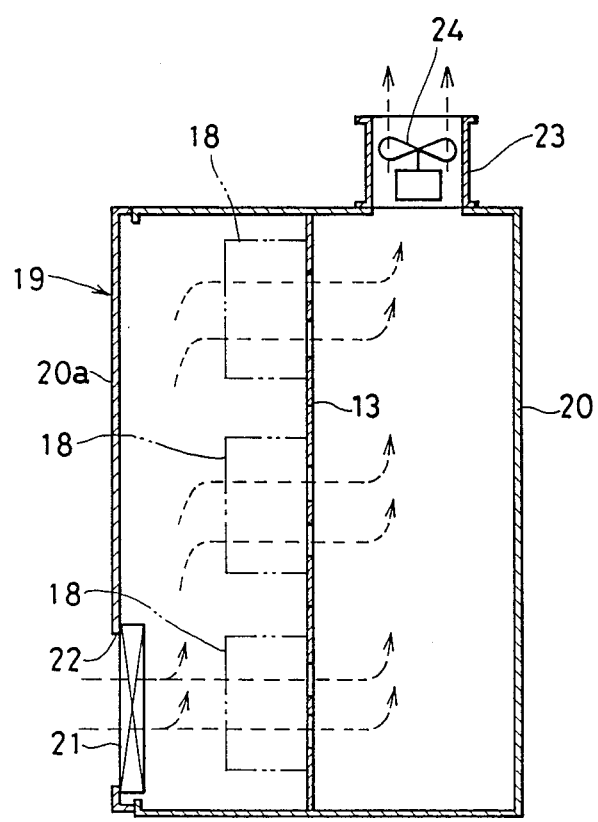
FIG. 8 is a longitudinal cross sectional view of a semiconductor converter including the semiconductor units shown in FIGS. 6 and 7.

In FIG. 8, there is shown a semiconductor converter 19 to which the semiconductor units 18 shown in FIGS. 6 and 7, each unit including the semiconductor stack of the present invention shown in FIG. 3, are applied. The semiconductor converter 19 comprises a box frame 20 having a front door 20a with an air inlet opening 22 in its lower portion, an air filter 21 mounted to the internal surface of the air inlet opening portion, an exhaust air duct 23 disposed onto the top of the box frame 20, a cooling fan 24 arranged within the exhaust air duct 23, and the semiconductor units 18 vertically mounted to the insulating plate 13 which is vertically arranged within the box frame 20.

In this case, a cooling air is introduced into the inside of the box frame 20 through the air inlet opening 22 and the air filter 21 in virtue of the operation of the cooling fan 24, and then the cooling air passes through the semiconductor units 18 within the box frame 20 while the cooling air cools the semiconductor units 18. Then, the cooling air is discharged outside from the exhaust air duct 23. In this embodiment, the cooling air may be introduced from the exhaust air duct 23 and then may be discharged from the air inlet opening 22 in the reverse manner.

In this embodiment, although the rectangular opening 17b is used for passing through the cooling air for cooling the fuses 1 and the lower heat sink 4, of course, two openings may be separately provided for the fuses 1 and the lower heat sink 4.

It is readily understood from the description of the preferred embodiments of the present invention that there is provided a semiconductor stack which is capable of replacing fuses with new ones in a simple manner and of preventing a breakdown of the fuses due to an excessive tensile stress given thereto, and which has a simple structure and is compact in its construction.

Although the present invention has been described in its preferred embodiments with reference to the accompanying drawings, it is readily understood that the present invention is not restricted to the preferred embodiments described above and that the various changes and modifications may be made in the present invention by a person skilled in the art without departing from the spirit and scope of the present invention.

What is claimed is:

1. A semiconductor stack, comprising:
   a semiconductor element;
   at least one heat sink thermally coupled on one side to the semiconductor element;
   a first conductor plate contacted with a second side of the heat sink opposite the semiconductor element;
   clamp members for tightly fastening the semiconductor element, the heat sink and the first conductor plate in series;
   a second conductor plate; and
   at least two fuse members secured in parallel between the first and second conductor plates, one of the first and second conductor plates having at least one slit in one end portion in order to form at least two branch portions, one end of each fuse member being secured to the two branch portions of the one conductor plate, the other end of each fuse member being secured to the other of the first and second conductor plates.

2. A semiconductor stack as defined in claim 1, wherein the slit is formed in the first conductor plate.

3. A semiconductor stack as defined in claim 1, wherein the slit is formed in the second conductor plate.

4. A semiconductor plate as defined in claim 1, wherein the fuse members are arranged in front of and below the heat sink.

5. A semiconductor stack as defined in claim 1, wherein the fuse members are arranged in one side of the heat sink.

6. A semiconductor stack, comprising:
   a semiconductor element;
   at least one heat sink thermally coupled on one side to the semiconductor element;
   a first conductor plate contacted with a second side of the heat sink opposite the semiconductor element;
   clamp members for tightly fastening the semiconductor element, the heat sink and the first conductor plate in series,
   a second conductor plate; and
   at least two fuse members secured in parallel between the first and second conductor plates, one of the first and second conductor plates having at least one slit in one end portion in order to form at least two branch portions, one end of each fuse member being secured to the two branch portions of the one conductor plate, the other end of each fuse member being secured to the other of the first and second conductor plates;
   wherein the fuse members are arranged in front of and below the heat sink; and
   wherein the clamp members are mounted to an insulating plate having an opening for flowing a cooling air passing through the fuses and the heat sink, and a U-shaped insulating plate so surrounds the fuse members that the U-shaped insulating plate and the first and the second conductor plates constitute an airflow duct for the fuses.

7. A semiconductor unit, comprising:
   a semiconductor element;
   at least one heat sink arranged in one side of the semiconductor element, for cooling the semiconductor element;
   a first conductor plate contacted with an opposite side of the heat sink to the semiconductor element;
   clamp members for tightly fastening the semiconductor element, the heat sink and the first conductor plate in series;
   a second conductor plate;
   at least two fuse members secured in parallel between the first and second conductor plates, one of the first and second conductor plates having at least one slit in its one end portion, the slit forming at least two branch portions, one ends of the fuse members being secured to the two branch portions of the one conductor plate, the other ends of the fuse members being secured to the other of the first and second conductor plates;
   an insulating plate having an opening for flowing a cooling air passing through the fuses and the heat sink, the clamp members being mounted to the insulating plate; and
   a U-shaped insulating plate for surrounding the fuse members so that the U-shaped insulating plate and the first and second conductor plates constitute an airflow duct for the fuses.

8. A semiconductor unit as defined in claim 7, wherein the slit is formed in the first conductor plate.

9. A semiconductor unit as defined in claim 7, wherein the slit is formed in the second conductor plate.

10. A semiconductor unit as defined in claim 7, wherein the fuse members are arranged in front of and below the heat sink.

* * * * *